United States Patent
Bianca et al.

[11] Patent Number: 6,052,895
[45] Date of Patent: *Apr. 25, 2000

[54] CONFORMING PRESS-FIT CONTACT PIN FOR PRINTED CIRCUIT BOARD

[75] Inventors: Giuseppe Bianca, Escondido; Robert M. Bogursky, Encintas, both of Calif.

[73] Assignee: Auto Splice Systems, Inc., San Diego, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/124,631

[22] Filed: Jul. 29, 1998

Related U.S. Application Data

[62] Division of application No. 08/733,393, Oct. 18, 1996, Pat. No. 5,893,779.

[51] Int. Cl.[7] ................................ H01R 43/20
[52] U.S. Cl. ......................... 29/881; 29/832; 29/837; 29/838; 29/842; 29/845; 29/874; 29/876
[58] Field of Search .................. 29/832, 837, 838, 29/842, 845, 874, 876, 881

[56] References Cited

U.S. PATENT DOCUMENTS

| | | |
|---|---|---|
| 3,634,819 | 1/1972 | Evans . |
| 3,783,433 | 1/1974 | Kurtz et al. . |
| 4,066,326 | 1/1978 | Lovendusky . |
| 4,186,982 | 2/1980 | Cobaugh et al. ................ 339/17 C |
| 4,330,927 | 5/1982 | Wolfthal ...................... 29/566.2 X |
| 4,464,009 | 8/1984 | Thaler et al. . |
| 4,586,778 | 5/1986 | Walter et al. . |
| 4,606,589 | 8/1986 | Elsbree, Jr. et al. . |
| 4,740,166 | 4/1988 | Barnehouse . |
| 4,743,081 | 5/1988 | Cobaugh . |
| 4,759,721 | 7/1988 | Moore et al. . |
| 4,763,408 | 8/1988 | Heisey et al. ........................ 29/874 |
| 4,793,817 | 12/1988 | Hiesbock . |
| 4,821,411 | 4/1989 | Yaegashi ............................ 29/874 |
| 4,857,018 | 8/1989 | Pickles . |
| 4,969,259 | 11/1990 | Macek et al. . |
| 5,195,350 | 3/1993 | Aikens et al. .................... 29/874 X |

FOREIGN PATENT DOCUMENTS 2127625  4/1984  United Kingdom .

*Primary Examiner*—Lee Young
*Assistant Examiner*—Rick Kiltae Chang

[57] ABSTRACT

A novel press-fit electrically-conductive contact member, as, for example, an electrically-conductive metal pin, characterized by a conforming section which has an elastically-deformable region which acts as a spring and which is adapted to engage a substrate hole in a press-fitting relationship. The conforming section comprises opposed beam members configured to accommodate a considerably larger hole tolerance yet still provide sufficient retention force to stabilize the pin during a soldering process that such substrates may typically undergo. The beam cross-sections are configured to allow them to occupy a side-by-side position. Contact members with the conforming section can be manufactured by a wire-forming process in which end-to-end connected pins are formed as a continuous strip needing no excess material for carrying the pins, nor are any air gaps formed between the pins, and thus the finished continuous strip of pins can be wound up on a reel.

8 Claims, 3 Drawing Sheets

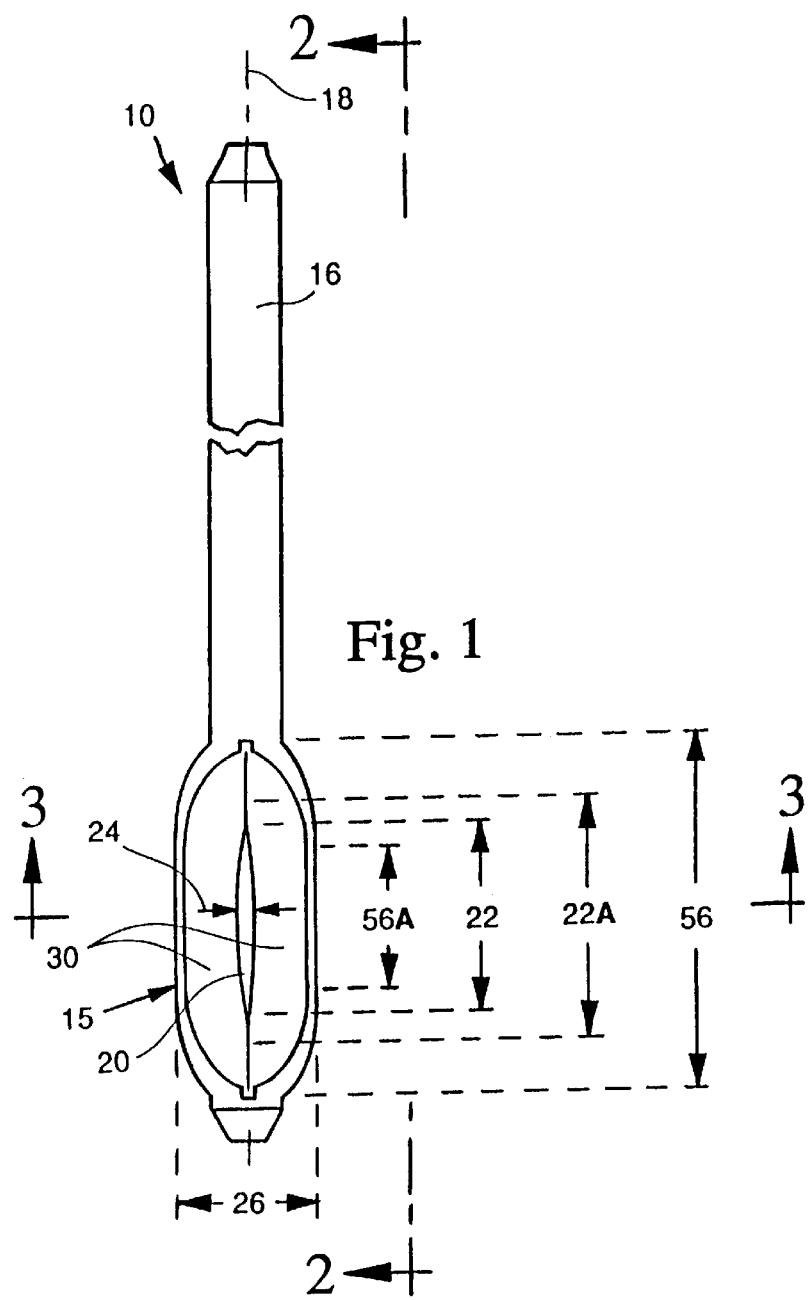
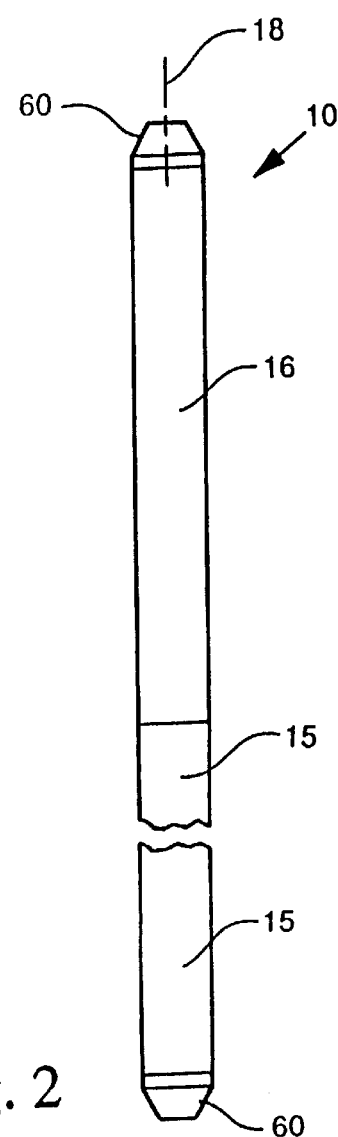
Fig. 1
Fig. 2

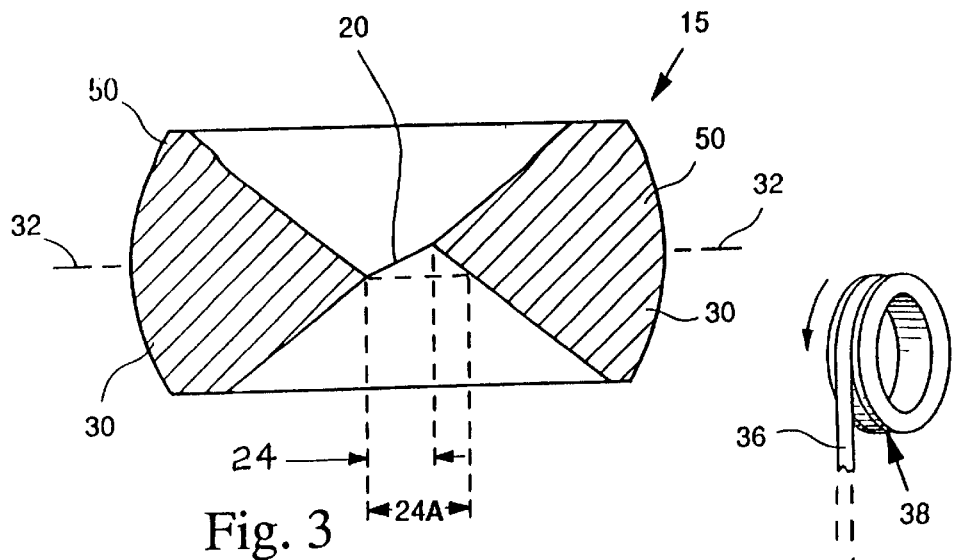
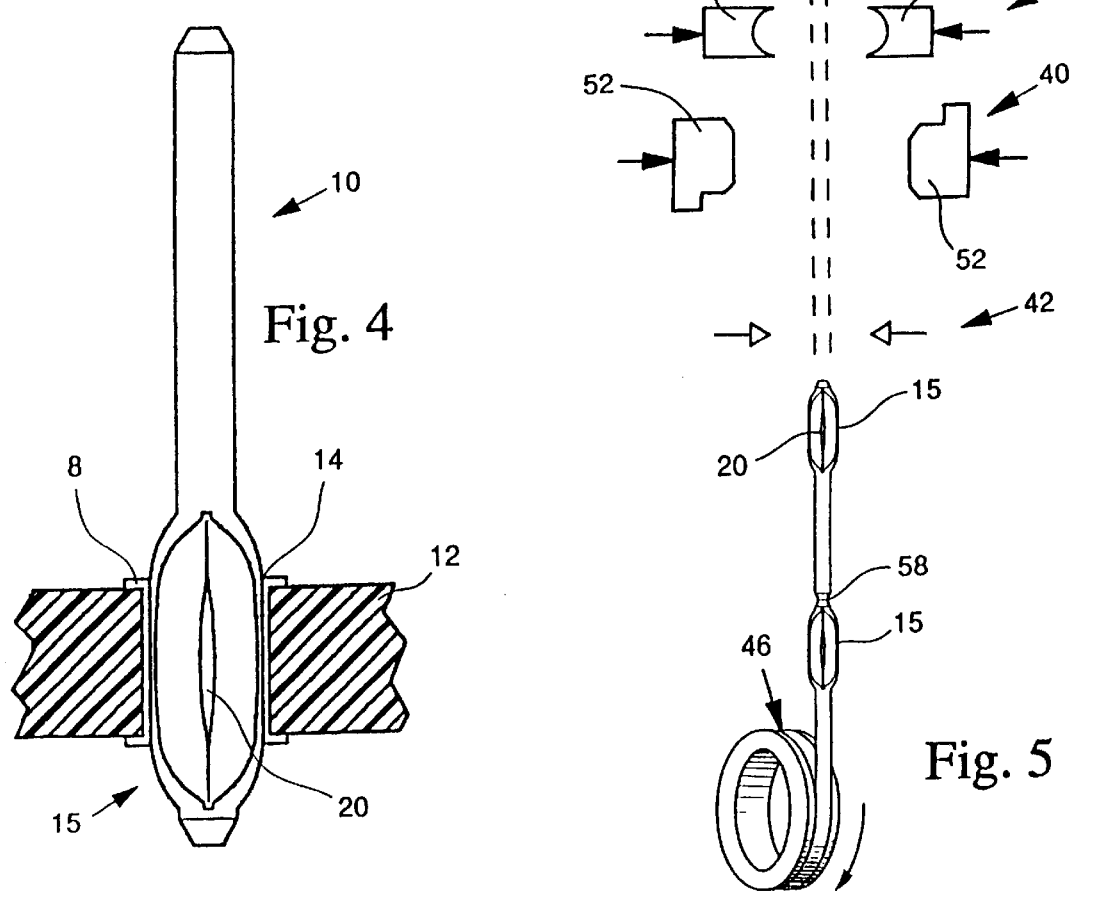

CONFORMING PRESS-FIT CONTACT PIN FOR PRINTED CIRCUIT BOARD

This application is a division of application Ser. No. 08/733,393, filed Oct. 18, 1996, now U.S. Pat. No. 5,893,779.

The invention is directed to a conforming contact member that is press-fitted into preformed holes in a substrate, such as a printed circuit board (PCB) or the like.

BACKGROUND OF INVENTION

Two types of press-fit techniques for mounting electrically-conductive contact members such as pins into the preformed typically plated-through holes in a PCB are known. In the first type, a solid pin is used, which has no spring energy.

The solid pin is press-fitted into the non-elastically-deformable area of the plated-through hole, and thus requires soldering for long term reliability. In a typical use for this method, to ensure reasonable retention force of the press-fitted connection prior to soldering, the plated-through hole tolerance for the solid pin is kept at ±0.002 inches or less, which increases PCB manufacturing cost to stay within such a tight tolerance. Further disadvantages include possible hole deformation and damage of the hole under-plating and trace circuit connections, which are initially undetectable and therefore detracts from long-term reliability.

The second type uses what is known as a press-fit compliant pin, which provides limited elastic deformation of a compliant section in the pin structure and does not require soldering. While this contact member can be removed, it cannot be reused due to permanent deformation of the compliant section. In a typical use for this method, the plated-through hole tolerance for the compliant pin is kept at ±0.003 inches or less, which still requires relatively high PCB manufacturing cost especially in punched versus drilled PCB holes. The tolerance is also hole-size related, which means that the smaller the hole, the tighter the tolerances required and the higher the fabrication cost. Examples of compliant pin constructions can be found described in U.S. Pat. Nos. 4,186,982; 4,464,009; 4,586,778; 4,740,166; 4,793,817.

The most common manufacturing method for both these types of pins is to stamp the parts from an unplated metal strip in a progressive die, utilyzing a carrier strip (ultimately removed as waste) to carry the pins through the manufacturing equipment. The carrier strip is used at times for continuous reeling of the pins for strip line plating and subsequent automatic placement (insertion into a connection housing or directly into the PCB). The customer-user is responsible for accommodating and ultimately disposing of the removed carrier strip. In the progressive die stamping process, a punch-in die removes metal between adjacent contacts pinned leaving sharp corners and rough surfaces. These conditions are difficult to eliminate due to the tooling not having effective access to the pin sides. As a result, when producing a press-fit pin in a progressive die from a metal strip, the press-fit section frequently causes PCB hole damage. Also, when there is a space between adjacent pins, the number of pins that can be packaged on a reel is reduced. Still further, it is desirable at times to produce press-fit pins that are round rather than square. Progressive die stamping cannot produce round pins.

SUMMARY OF INVENTION

A principal object of the invention is a novel press-fit (hereinafter defined) electrically-conductive contact member that can be reliably mounted in substrates while permitting larger hole tolerances than the known schemes.

Another object of the invention is a novel male press-fit electrically-conductive contact member that is less expensive to manufacture and is less costly to package.

Still another object of the invention is a new method for fabricating male press-fit electrically-conductive contact members with various cross-sections and with compliant sections.

Yet another object of the invention is a new method for fabricating male press-fit electrically-conductive contact members with compliant sections that is scrapless.

These and other objects are achieved in accordance with one feature of the invention by a novel press-fit electrically-conductive contact member, as, for example, an electrically-conductive metal pin, characterized by what we term a "conforming section" which has an elastically-deformable region which acts as a spring and which is adapted to engage a substrate hole in a press-fitting relationship. The conforming section is configured to accommodate a considerably larger hole tolerance yet still provide sufficient retention force to stabilize the pin during a soldering process that such substrates may typically undergo.

In accordance with a further feature of the invention, the contact member comprises an elastically-deformable conforming section having an eye-of-the-needle construction comprising a through-slot bounded by relatively long spring beam members configured to allow a substantially larger lateral movement range during compression when the pin is inserted in the substrate hole. It is this larger lateral movement range that allows the increase in hole tolerances while providing sufficient retaining force.

In accordance with a preferred embodiment of the invention, the contact member is made as a one-piece member and its conforming section comprises a through-slot bounded by relatively long beam members that are offset with respect to each other and to a vertical plane through the pin center axis and parallel to the slot. The offset configuration provides increased lateral beam movement within the slot toward one another before abutting in a fully closed position in which they are, viewed from the center vertical plane, more in a side-by-side position than aligned as in some of the known compliant pins. The beam cross-sections are configured to allow them to occupy a side-by-side position.

In accordance with yet another feature of the invention, pins with the conforming section are manufactured connected end-to-end by a wire-forming process needing no excess material for carrying the pins. Nor are their spaces between adjacent pins, and thus the finished product can be wound up on a reel in a higher density format, lowering packaging costs as well as shipping and handling expenses. This process allows forming of each pin 360° around the pin thereby allowing in the manufacture of a square pin the use of a forming die to round the conforming section of the pin. Similarly, this process permits reshaping of the conforming section of a round wire pin.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

SUMMARY OF THE DRAWINGS

In the drawings:

FIG. 1 is a front elevational view of one form of contact member comprising a conforming section in accordance with the invention;

FIG. 2 is a side view of the contact member of FIG. 1 along the line 2—2;

FIG. 3 is a cross-sectional view of the conforming section of the contact member of FIG. 1 along the line 3—3;

FIG. 4 is a partial cros-sectional view illustrating the contact member of FIG. 1 mounted in part of a PCB;

FIG. 5 is a schematic view of one form of fabrication method of a contact member in accordance with the invention;

DETAILED DESCRIPTION OF PREFERRED EMBODIMENTS

Figure 6:
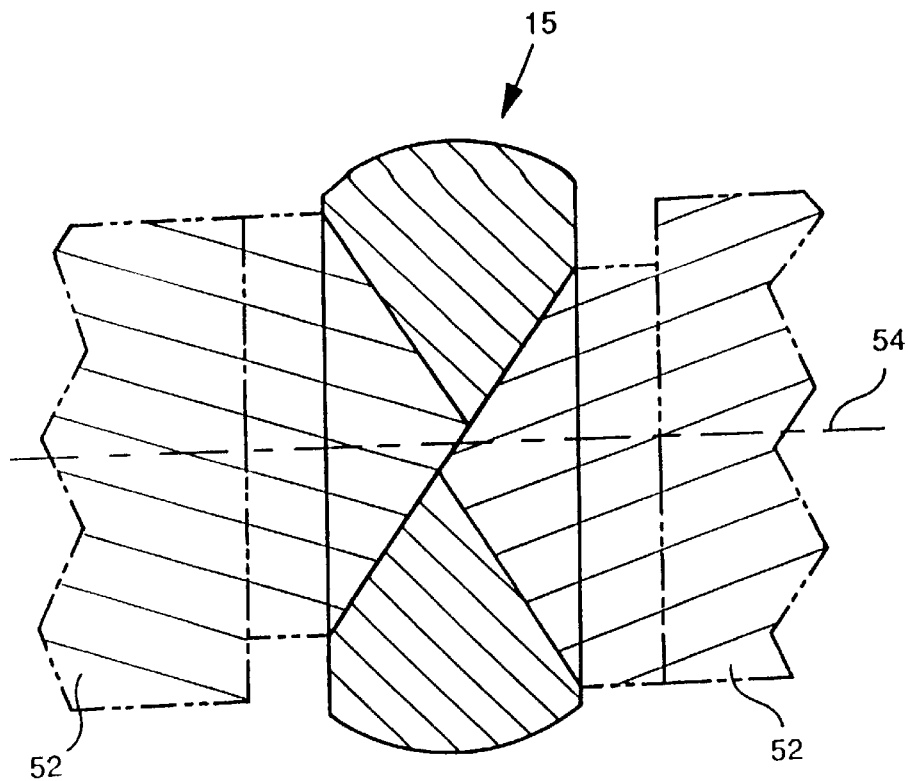
FIG. 6 is an enlarged view illustrating forming of the conforming section of the pin strip of FIG. 5.

FIGS. 1, 2, and 3 illustrate one form of contact member comprising a conforming section in accordance with the invention. The most important application of the invention is the fabrication of metal pins for insertion by automatic insertion machines into through-plated holes of a PCB. However, the invention is not limited to metal pins, nor to through-plated holes, nor to PCBs. The invention can be used with any kind of substrate that has openings into which a projecting member needs to be mounted by insertion in the holes. While a common purpose would be to establish an electrically-conductive contact between an electrically-conductive portion on the contact member and an electrically-conductive part on the substrate, the latter need not be on the walls of the hole but could be a pad or other electrically-conductive member on a surface of the substrate. More, while the more common usage would involve circular or square male contact members engaging circular holes in the substrate, the invention is also applicable to contact members such as lugs, tabs, posts or the like possessing non-circular cross-sections for engaging noncircular holes in a substrate, as well as to pins having rectangular or hexagonal cross-sections. The invention can also be applied to projecting members from sockets that can use the conforming section of the invention for mounting of the socket on a substrate. However, to simplify the description, with the understanding that the invention is not so limited, the invention will be described and illustrated in the most common application employing in this case, as the contact member, a male pin 10 intended to receive a female connector (not shown) for establishing an electrical connection between a wire or component on a PCB connected to the female connector and a component on a PCB and connected via a conductive trace to the pin 10.

FIG. 4 illustrates schematically a portion of a PCB 12 with the pin 10 mounted (inserted) in a plated-through hole 14 of the PCB 12. The insertion is typically carried out by a placement machine, known as an automatic insertion machine, which detaches a pin from a reel of continuously-formed wire and inserts it into the board hole, often under computer control. The fitting of the pin 10 in the hole 14 is a conforming press-fit (hereinafter defined), so that the pin will be stably held in position for soldering or further processing to the PCB. To prevent damage to the PCB hole plating 8 while allowing pins with a certain range of dimensions to be used, the hole size 14 must be kept within certain tolerances. With looser hole tolerances, particularly on PCBs with small holes, many holes, or thicker boards, production yields are significantly higher. A principal feature of the invention is to provide a pin construction with an elastically-deformable conforming section 15 for engaging the PCB hole 14 that allows a larger range of tolerances for the hole size of the PCB.

As will be seen in FIGS. 1–3, the main body 16 of the pin, which may be square or round, has a simple cross-section which is square if the pin is square or round if the pin is round. Close to the pin bottom is located the conforming section 15, which is an enlarged section whose lateral dimension 26 (horizontal in FIG. 1 of the drawing) extends generally transverse to the longitudinal axis 18 of the pin 10. In the center of the conforming section 15 is a vertical through-slot 20 that has a length (height in FIG. 1) indicated by reference numeral 22 and a width. The widest slot width, when uncompressed in a relaxed position, referred to from time to time as the gap, is referenced 24.

Several practical examples, which are not to be considered limiting, will now be given for certain industry standard pin sizes, typically 0.018, 0.025, and 0.045 inches, typically with ±0.001 inches tolerance. These standard pin size examples that follow apply equally to both round and square pins. With the known solid press-fit pin, the maximum tolerance allowed in the PCB hole 14 is ±0.002 inches or less, whereas with the known pin with a compliant section, the maximum tolerance allowed in the PCB hole for the larger pin is ±0.003 inches or less, but which typically is smaller for smaller size pins.

The pin with the conforming section 15 of the invention will allow a maximum hole tolerance of ±0.005 inches for the two larger sized pins and ±0.003 inches for the smaller 0.018 inches pin. This provide a 60% or more increase in PCB hole tolerance and a significantly lower fabrication cost for the PCB.

These new results have been obtained by lengthening the pin beam members, designated 30, that flank the through-slot 20 resulting in a reduced spring rate, discussed below, and by providing a configuration of the conforming section 15 that allows a much larger range of lateral movement or compression when the pin is inserted in the PCB hole with the conforming section engaging the hole walls. In accordance with this feature of the invention, the flanking beam members 30 are allowed to move toward one another before touching a distance 24A that exceeds the gap width 24. This is achieved, in accordance with a preferred embodiment, by forming the through-slot 20 by a forming process that causes the walls defining the slot to be slightly offset from one another viewed from a vertical plane 32 through the pin axis 18 and parallel to the slot (that corresponds in the drawing to the plane of the drawing for FIG. 1 and perpendicular to the plane of the drawing of FIG. 3). The clearance width, referenced 24A in FIG. 3, is the horizontal distance between the beam members 30 when uncompressed and in a relaxed state, and represents the actual distance the beam members 30 can move toward each other before touching. The overall width of the conforming section 15, at its widest part, is referenced 26. The length 56 is the height of the conforming section 15. The shorter length 56A is the vertical dimension where the sides of the conforming section 15 are straight. Since the section 56A is the widest part of the conforming section 15, it is the only part of the conforming section 15 that actually touches the inside of the PCB hole. Above and below the length 56A, the straight sides curve inward forming a transition region before joining the narrower sides of the main body 16 of the pin 10. The gap 24 also has straight sides within the section 56A and is the actual length of the gap (height in FIG. 1) which collapses evenly as the conforming section 15 is compressed. The length indicated by numeral 22A represents the height within the conforming section 15 where the beam members 30 actually touch, and is positioned with respect to the length referenced 56A such that, when the conforming section 15 is inserted into the PCB hole, the gap 24A is wide enough to permit compression of conforming section 15 within acceptable criteria determined by the application. It will be understood that the lateral compression allowed is determined by the recommended hole tolerances so as to prevent the gap 24A from being exceeded. In other words, the beam members 30 do not actually touch under maximum compression of the conforming section 15. The height of the wider gap section 24A in the relaxed state must be at least equal to or greater than the height of the widest section (26) of the conforming section 15, which is reference length 56A. As will be observed, the conforming section 15 has approximately the same thickness as the main body 16 of the pin in the side view of FIG. 2. only in the front view of FIG. 1, where the through-slot 20 is present, does the width 26 exceed that of the main body 16 of the pin. This excess width of the conforming section 15 in the plane of FIG. 1 is relied on to establish the desired press-fit in the typically round PCB hole 14.

FIG. 5 illustrates one form of the forming process in accordance with the invention. The process is a continuous wire-forming process generally of the type described in U.S. Pat. No. 4,318,964, whose contents are herein incorporated by reference, in which a continuous length 36 of preplated copper-alloy electrical-pin-forming wire, supplied from a reel 38, is typically fed through a machine, in turn through a slot-punching station 40 and then through a notching station 42, except that square cross-sectioned wire, which is more popular, is first fed through a rounding station 44, followed by reeling up 46 of the finished continuous strip of finished pins. Any copper alloy, such as brass, with sufficient spring force can be used in this application. At the rounding station 44, forming dies 48 are applied 360 around the wire as shown in FIG. 5 to form spaced rounded sections 50 (see FIG. 3) as the wire 36 is advanced through the machine. The rounded sections 50 are formed where the spaced conforming sections 15 will be formed. The rounding is preferably equal to or slightly less than the radius of the plated-through hole 14 in the PCB. The resultant rounded smooth sides of the conforming section (see FIG. 3) reduces hole damage and lowers insertion forces.

Figure 7:
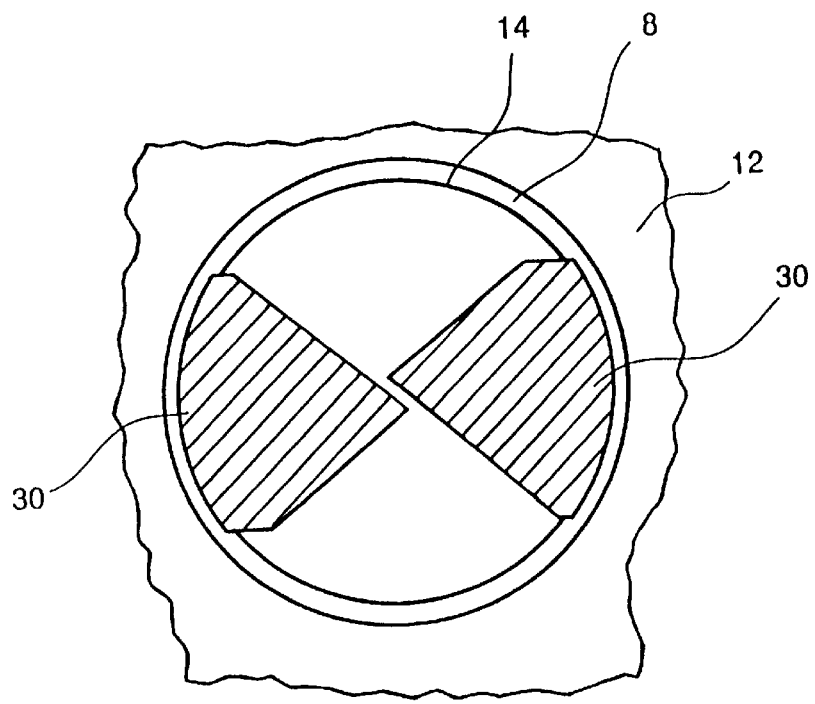
FIG. 7 is a schematic view showing overlap of the opposed beam members of the conforming section when the contact member of FIG. 1 is inserted into a substrate hole.

Following the rounding operation, opposed dies 52 with triangular faces punch the through-slot 20 which causes the wire-enlarged conforming section 15 shown in FIG. 1. The punching is carried out by dies 52 slightly laterally displaced relative to one another, for example, about 0.004 inches above for the left die and about 0.004 inches below for the right die with respect to the slot center line designated 54 in FIG. 6. The die punching displaces metal of the wire or of the rounded section to form the conforming section which in cross-section (FIG. 1) comprises two slightly displaced triangular (in cross-section) non-symmetrical opposed beam members 30 defining the slot 20 with a gap width 24. The center lines of the triangular sections, running horizontally from the triangle peaks in FIG. 6, are also offset, with the result that, when the conforming section 19 is subjected to compression forces, which occur when forced into the PCB hole, the opposed beam members 30 will move toward one another and will not abut unless the distance moved exceeds the gap width 24A, which is not desired. FIG. 7 illustrates schematically how the opposed beam members 30 when compressed can overlap thus providing a range of movement exceeding the gap width 24. As one example, which is not to be considered limiting, for a 0.045 inches pin, the gap width 24 is about 0.008 inches, the peak center lines are offset by about 0.011 inches, and the allowed lateral movement 24A before abutment occurs is about 0.016 inches. Preferably, the clearance width 24A of the conforming section, for the example given, is such that the conforming section must be approximately 0.014 inches minimum to allow for ±0.005 inches plated-through hole tolerance, conforming section manufacturing tolerance, and residual spring force during soldering.

The length of the conforming section, designated 56 in FIG. 1, is chosen to provide a low power spring rate as defined below. For the pin examples given, the preferred length 56 of each of the opposed beam members is about 0.070 inches for a pin with a nominal dimension of 0.018 inches, about 0.125 inches for a pin with a nominal dimension of 0.025 inches, and about 0.240 inches for a pin with a nominal dimension of 0.045 inches. For plated-through hole sizes and tolerance of 0.023±0.003 inches for a pin with a nominal dimension of 0.018 inches, 0.038±0.005 inches for a pin with a nominal dimension of 0.025 inches, and 0.065±0.005 inches for a pin with a nominal dimension of 0.045 inches, the force in spring rate grams/0.001 inches of conforming section deflection preferably required to compress the conforming section is about 150–350 for a pin with a nominal dimension of 0.018–0.045 inches. The corresponding retention forces of the pin in the hole are as follows. The minimum retention force for the maximum recommended hole is about 3 lbs for a pin with a nominal dimension of 0.018 inches, about 4 lbs for a pin with a nominal dimension of 0.025 inches, and about 9 lbs for a pin with a nominal dimension of 0.045 inches. The maximum insertion force for the mimimum recommended hole is about 12 lbs for a pin with a nominal dimension of 0.018 inches, about 25 lbs for a pin with a nominal dimension of 0.025 inches, and about 32 lbs for a pin with a nominal dimension of 0.045 inches. The maximum hole deformation when the pin is press-fitted in the hole is less than about 0.001 inches on radius, which corresponds to about a 50%–100% improvement over the known press-fit pin. For the examples given above, the preferred overall width 26 of the conforming section is about 0.033±0.001 inches for a pin with a nominal dimension of 0.018 inches, about 0.049±0.001 inches for a pin with a nominal dimension of 0.025 inches, and about 0.075±0.002 inches for a pin with a nominal dimension of 0.045 inches. The overall pin lengths can cover a wide range, for example, from 0.25–2 inches.

Press-fitted, as used herein in describing the invention, means a minimum interference between a mating hole and contact member conforming section that substantially equals the (sum of the diameter of hole and its maximum tolerance) less the (minimum diameter of the conforming section section in its non-compressed mode), divided by 2. For the 0.018 pin, this minimum interference amounts to [(0.023+ 0.003)–0.032]/2=–0.003 inches.

In addition to the advantages set forth above, the inserted pins may or may not be soldered depending on the mechanical, environmental, and electrical performance requirements of the application. Moreover, they may be inserted in the PCB hole, removed before soldering, and re-used several times without damage to the hole or to the pin.

It is noted that retention of the contact member of the invention in the substrate hole, before soldering, is a result of the spring force generated by the flexed opposed beam members which press tightly along their partly circular outer surfaces against the circular surface of the typical hole, as shown in FIG. 7, producing normal forces between the conforming section and the hole walls, but not between the opposed beam members themselves. The through-slot in the center of the conforming section performs the important function of providing ample space for the triangular-shaped opposed beam members to move toward one another and to overlap at the slot furnishing the increased range of movement desired. The through-slot construction also permits the important benefit of allowing the manufacture as described of a series of the contact members by a wire-forming process providing reeled end-to-end, notched, continuous contact members ready for insertion by conventional insertion machines into substrates as desired, typically realized by separating the lead pin at a notch 58 from the continuous strip during the insertion process. The notching also conveniently forms bevel ends 60 at opposite ends of the one-piece contact member.

The examples given for the nominally sized pins apply to both round and square pins, and the annexed claims should be understood in the same light.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method of fabricating a male electrically-conductive contact member for press-fitting into an electrically-conductive hole in a PCB, said hole having a nominal dimension with positive and negative tolerances, comprising:

a) providing an elongated continuous length of metal wire (36) having a round cross-section and a longitudinal axis (18), b) providing opposed punching dies (52) with similar forward-projecting triangular faces each having a furthest forward-projecting region, said punching dies (52) being positioned laterally of and on opposite sides of the elongated wire (36), said punching dies being arranged for lateral movement with respect to the wire axis with their forward-projecting region in front toward facing sides of a first portion of the round wire, c) causing the opposed punching dies (52) to move laterally to the wire axis with their forward-projecting region in front and impact on the facing sides of the first portion of the round wire to form in the first portion of the round wire impacted a conforming section (15) with an axially-extending through-slot (20), said punching dies (52) being positioned in a slightly offset relationship with respect to an imaginary line (54) transverse to the elongated wire (36) and passing through a center of the axially-extending through-slot (20) such that the furthest forward-projecting region of one of the dies is slightly laterally displaced on one side of the imaginary line (54) and the furthest forward-projecting region of the other of the dies is slightly laterally displaced on the other side of the imaginary line (54), d) said through-slot (20) formed by the forward-projecting faces of the punching dies having a lateral gap dimension (24) bounded by opposed beam members (30) that are offset with respect to each other and to a plane (32) through the wire axis and parallel to the through-slot (20), said opposed beam members (30) having a combined widest lateral width (26) transverse to the axis that exceeds a sum of the hole's nominal dimension and the hole's positive tolerance wherein when the conforming section (15) of the wire is inserted into the hole the conforming section will be press-fitted into the hole without damaging the hole, the opposed beam members (30) of said conforming section (15) being configured such that, when the contact member is press-fitted into the hole, the opposed beam members (30) are capable of lateral movement toward one another tending to close the through-slot in an amount (24A) that exceeds the widest lateral gap dimension (24).

2. The method of claim 1, further comprising the steps of:

d) following step (d), advancing the wire until a second portion longitudinally-displaced from the first portion is positioned between the punching dies (52), e) repeating steps (b), (c) and d) on the second portion of the wire to form a series of spaced conforming sections (15) along the length of the wire, f) forming weakened regions (58) in the wire between adjacent conforming sections (15) wherein individual wire portions can be separated from the length of the wire at the weakened regions to form contact members (10).

3. The method of claim 1, wherein the wire is supplied from a reel (38) of wire, and a completed length of wire with multiple conforming sections (15) separated by weakened regions (58) is wound up on a reel (46).

4. The method of claim 1, wherein the length of the wire is a preplated copper alloy.

5. A method of fabricating a male electrically-conductive contact member for press-fitting into an electrically-conductive hole in a PCB, said hole having a nominal dimension with positive and negative tolerances, comprising:

a) providing an elongated continuous length of metal wire (36) having a rectangular cross-section and a longitudinal axis (18), b) subjecting a first portion of the rectangular cross-section wire (36) to a die operation (44) that forms a rounded wire section, c) providing opposed punching dies (52) with similar forward-projecting triangular faces each having a furthest forward-projecting region, said punching dies (52) being positioned laterally of and on opposite sides of the elongated wire (36), said punching dies being arranged for lateral movement with respect to the wire axis with their forward-projecting region in front toward a facing sides of the rounded wire section, d) causing the opposed punching dies (52) to move laterally to the wire axis and impact on the facing sides of the rounded wire section to form in the rounded wire section impacted a conforming section (15) with an axially-extending through-slot (20), said punching dies (52) being positioned in a slightly offset relationship with respect to an imaginary line (54) transverse to the elongated wire (36) and passing through a center of the axially-extending through-slot (20) such that the furthest forward-projecting region of one of the dies is slightly laterally displaced on one side of the imaginary line (54) and the furthest forward-projecting region of the other of the dies is slightly laterally displaced on the other side of the imaginary line (54), e) said through-slot (20) formed by the forward-projecting faces of the punching dies having a lateral gap dimension (24) bounded by opposed beam members (30) that are offset with respect to each other and to a plane (32) through the wire axis and parallel to the through-slot (20), said opposed beam members (30) having a combined widest lateral width (26) transverse to the axis that exceeds a sum of the hole's nominal dimension and the hole's positive tolerance wherein when the conforming section (15) of the wire is inserted into the hole the conforming section will be press-fitted into the hole without damaging the hole, the opposed beam members (30) of said conforming section (15) being configured such that, when the contact member is press-fitted into the hole, the opposed beam members (30) are capable of lateral movement toward one another tending to close the through-slot in an amount (24A) that exceeds the widest lateral gap dimension (24).

6. The method of claim 5, further comprising the steps of:

f) following step (e), advancing the wire and subjecting a second portion longitudinally-displaced from the first portion to a die operation (44) that forms a rounded wire section, g) advancing the wire until the rounded wire section at the second portion is positioned between the dies (52), h) repeating steps (c), (d) and e) on the second portion of the wire to form a series of spaced conforming sections (15) along the length of the wire, i) forming weakened regions (58) in the wire between adjacent conforming sections (15) wherein individual wire portions can be separated from the length of the wire at the weakened regions to form contact members (10).

7. The method of claim 5, wherein the wire is supplied from a reel of wire, and a completed length of wire with multiple conforming sections separated by weakened regions is wound up on a reel.

8. The method of claim 5, wherein the length of the wire is a preplated copper alloy.

* * * * *